United States Patent [19]

Tsukamoto et al.

[11] Patent Number: 4,931,897

[45] Date of Patent: Jun. 5, 1990

[54] METHOD OF MANUFACTURING SEMICONDUCTOR CAPACITIVE ELEMENT

[75] Inventors: Katsuhiro Tsukamoto; Masahiro Shimizu; Hiroshi Miyatake, all of Hyogo, Japan

[73] Assignee: Mitsubishi Denki Kabushiki Kaisha, Tokyo, Japan

[21] Appl. No.: 390,012

[22] Filed: Aug. 7, 1989

[30] Foreign Application Priority Data

Aug. 8, 1988 [JP] Japan ............................. 63-197643

[51] Int. Cl.$^5$ ..................... H01G 4/10; H01G 7/00; B01J 17/00; H01L 27/02
[52] U.S. Cl. ................................ 361/313; 29/25.42; 357/51; 427/79
[58] Field of Search ............................ 29/570.1, 25.42; 361/311, 312, 313; 427/79, 80, 96; 357/51

[56] References Cited

U.S. PATENT DOCUMENTS

| 3,864,817 | 2/1975 | Lapham et al. ............... 357/51 X |
| 4,464,701 | 8/1984 | Roberts et al. ................. 427/79 X |
| 4,543,594 | 9/1985 | Mohsen et al. .................... 357/51 |
| 4,628,405 | 12/1986 | Lippert ......................... 29/25.42 X |
| 4,823,181 | 4/1989 | Mohsen et al. .................... 357/51 |

FOREIGN PATENT DOCUMENTS 2784 1/1985 Japan .
55258 11/1986 Japan .

OTHER PUBLICATIONS

Y. Ohji et al., "Reliability of Nano-Meter Thick Multi-Layer Dielectric Films on Poly-Crystalline Silicon" 25th Annual Proceeding of Reliability Physics, pp. 55-59, 1987.

Primary Examiner—Donald A. Griffin
Attorney, Agent, or Firm—Lowe, Price, LeBlanc, Becker & Shur

[57] ABSTRACT

A method of manufacturing a semiconductor capacitor provided with a substrate, a dielectric film formed on the substrate and a pair of electrode layers stacked on both sides of the dielectric film comprises a step of forming a polycrystalline silicon layer for serving as one of the electrode layers on the substrate, a step of making at least a surface region of the polycrystalline silicon layer amorphous, a step of forming the dielectric film on the polycrystalline silicon layer while maintaining an amorphous surface state, and a step of forming another one of the electrode layers on the dielectric film. The lower electrode of the capacitor has its surface or the whole layer made amorphous. The surface of the electrode which is amorphous has smooth surface configuration, thereby improving the quality of the dielectric film formed thereon.

17 Claims, 6 Drawing Sheets

METHOD OF MANUFACTURING SEMICONDUCTOR CAPACITIVE ELEMENT

BACKGROUND OF THE INVENTION

1. Field of the Invention

The present invention relates to a semiconductor capacitive element, and more particularly, it relates to a method of manufacturing a semiconductor capacitive element, which can improve the quality of a dielectric thin film.

2. Description of the Background Art

One of passive elements forming a semiconductor integrated circuit device is a semiconductor capacitive element (capacitor). Such a capacitor is a basic and important element for forming a circuit. In general, a capacitor is formed by a dielectric film and a pair of electrode layers provided on both sides of the dielectric film. Voltage is applied across the electrode layers, thereby to store charges in the capacitor. The amount of charges storable in the capacitor, i.e., the so-called capacitance is in proportion to opposed areas of the electrodes and dielectric film, and in inverse proportion to the thickness of the dielectric film. In order to increase the capacitance, therefore, it is necessary to increase opposed areas of the electrodes and the dielectric film or reduce the thickness of the dielectric film.

On the other hand, technology development has been made to improve the density of integration of a semiconductor device, and a semiconductor element planarly formed on a semiconductor substrate is increasingly refined in structure. Under such circumstances, a plane occupied area of a capacitor, which is formed on a semiconductor substrate, is also reduced. In order to ensure prescribed capacitance on a reduced substrate surface, there has been invented a stacked type dynamic random access memory hereinafter referred to as D-RAM), in which a capacitor is stacked to be extended on a field oxide film and a gate electrode, as disclosed in Japanese Patent Publication Gazette No. 2784/1985 or 55258/1986, for example. In such a stacked type D-RAM, the capacitor is three-dimensionally extended to increase the junction area between electrodes, thereby to ensure capacitance. In another prior art example, a dielectric film is reduced in thickness independently of or in parallel with such a countermeasure in order to increase capacitance, as shown in "Reliability of Nano-Meter Thick Multi-Layer Dielectric Films on Polycrystalline Silicon" by Y. Ohji et al., 25th Annual Proceeding of Reliability Physics, pp. 55-59, 1987, for example. Such technique is now described.

FIGS. 8A to 8D show the structure of a capacitor having a lower electrode formed by a polycrystalline silicon layer along manufacturing steps. This capacitor is planarly stacked on the surface of a semiconductor substrate.

Figure 8A:
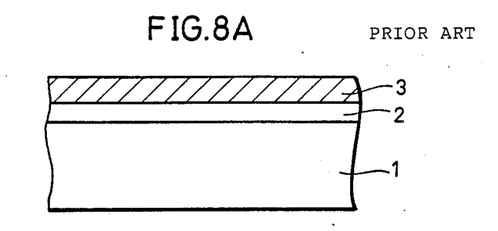
FIGS. 8A, 8B, 8C and 8D are sectional views showing steps of manufacturing a conventional semiconductor capacitive element.

As shown in FIG. 8A, a silicon oxide film 2 is first formed on the surface of a silicon substrate 1. Then, a polycrystalline silicon film 3 of about 200 nm in thickness is deposited on the surface of the silicon oxide film 2 by thermal decomposition of silane ($SiH_4$) gas through LPCVD (low pressure chemical vapor deposition). The deposited polycrystalline silicon film 3 is an aggregate of microcrystals of about 20 nm in crystal grain size. Thereafter an n-type impurity is added into the polycrystalline silicon film 3 by diffusion of phosphorus. The step of diffusing phosphorus is carried out by thermally diffusing phosphorus into the polycrystalline silicon film 3 from a source of $POCl_3$ in a reaction chamber under a high temperature of 875° C. The n-type impurity concentration of the polycrystalline silicon film 3 is set at to $10^{20}$ to $10^{21}/cm^3$ through the step of diffusing phosphorus. The above described step of introducing impurities to the polysilicon film 3 is not shown.

Figure 9:
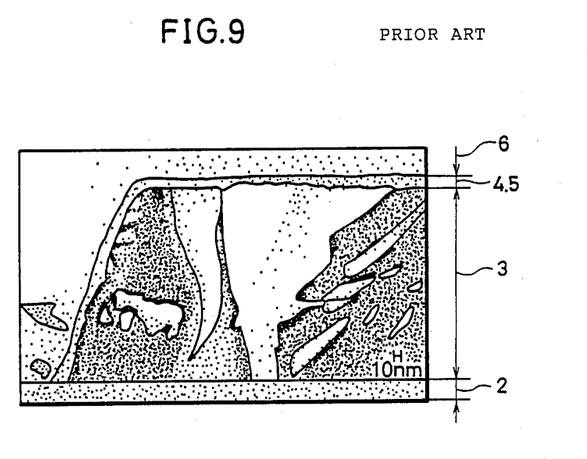
FIG. 9 is a typical sectional view showing crystal structure of the semiconductor capacitive element manufactured through the conventional method.

This phosphorus diffusion step is carried out under the temperature of 875° C., which is considerably higher than the deposition temperature of the polycrystalline silicon film 3. Therefore, the polycrystalline silicon film 3 is so recrystallized that its crystal grain size is extremely increased to about 150 to 250 nm. Such recrystallization is promoted by the phosphorus added into the polycrystalline silicon film 3 in high concentration. The surface configuration of the polycrystalline silicon film 3 is extremely irregularized due to increase the grain size by such recrystallization. FIG. 9 is a sectional view showing crystal structure of the recrystallized polycrystalline silicon film 3.

Figure 8B:
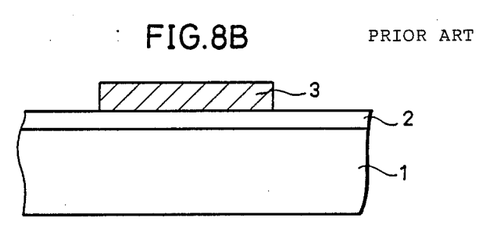

Then, the recrystallized polycrystalline silicon film 3 is etched through photolithography and etching, to form a lower electrode pattern 3 as shown in FIG. 8B.

Figure 8C:
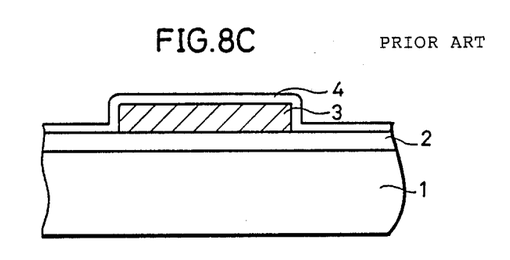

As shown in FIG. 8C, a silicon nitride film 4 of 7 to 10 nm in thickness is deposited on the surfaces of the silicon oxide film 2 and the lower electrode 3 by thermal reaction of dichlorosilane ($SiH_2Cl_2$) and ammonia ($NH_3$) through LPCVD. This silicon nitride film 4 forms a first layer in a dielectric film of the capacitor.

Figure 8D:
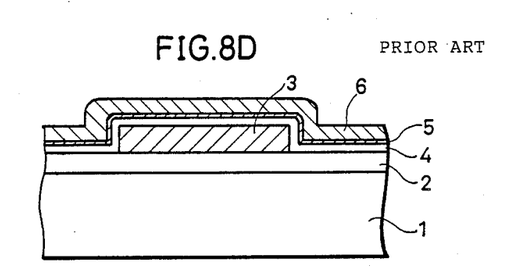

As shown in FIG. 8D, the surface of the silicon nitride film 4 is thermally oxidized to form a thin silicon oxide film 5 of 1 to 8 nm in thickness. This silicon oxide film 5 forms a second layer of the dielectric film. The thermal oxidation processing is performed in an atmosphere of wet $O_2$ (oxygen containing water vapor) at 900° C. The thin silicon oxide film 5 is adapted to improve dielectric breakdown voltage distribution and reliable lifetime of the capacitor. The reliable lifetime of the capacitor means the lifetime until more than a prescribed amount of leak current flows between both electrodes. Thereafter another polycrystalline silicon film 6 is formed on the surface of the silicon oxide film 5 through CVD. This polycrystalline silicon film 6 forms an upper electrode of the capacitor. The capacitor is formed through the aforementioned steps.

In the conventional capacitor whose capacitance is increased by reducing the thickness of the dielectric film, the silicon nitride film 4 forming the dielectric film is extremely reduced in thickness to 7 to 10 nm. However, the surface region of the lower electrode 3 on which the silicon nitride film 4 is formed is increased in crystal grain size due to recrystallization caused by high-temperature heat treatment for diffusing phosphorus. Thus, the surface region is extremely irregularized. Therefore, pinholes are easily formed in the thin silicon nitride film 4 through the rough surface of the lower electrode 3, while local electric field concentration is caused by such irregularity of the lower electrode surface to broaden the distribution of dielectric breakdown voltage among the capacitors, leading to reduction in reliable lifetime of the capacitor.

As described above, the conventional thin film capacitor has a drawback that the quality of the dielectric film is degraded and the reliable lifetime becomes shorter, since the grain size of the crystal is increased by the recrystallization of the lower electrode.

SUMMARY OF THE INVENTION

An object of the present invention is to improve the quality of a dielectric film of a semiconductor capacitive element.

Another object of the present invention is to provide a method of manufacturing a semiconductor capacitive element, which can improve dielectric breakdown voltage resistance of a semiconductor capacitive element having a lower electrode formed by a polycrystalline silicon film and comprising an extremely thin dielectric film, uniformalize voltage resistance distribution and increase reliability life.

Still another object of the present invention is to provide a method of manufacturing a semiconductor capacitive element, which can prevent recrystallization of a polycrystalline silicon layer forming a lower electrode of the semiconductor capacitive element.

A further object of the present invention is to provide a capacitor having a lower electrode whose surface area is made amorphous.

A semiconductor capacitive element in accordance with the present invention comprises a lower electrode having a surface region thereof made amorphous. According to the inventive method of manufacturing a semiconductor capacitive element, a polycrystalline silicon film for serving as a lower electrode is first formed and thereafter at least a surface region thereof is made amorphous. Thus, the surface of the polycrystalline silicon film is smoothly refined. Then, a thin dielectric film is formed on the amorphous surface of the polycrystalline silicon film. This dielectric film is formed under such condition that the polycrystalline silicon film having the amorphous surface is not recrystallized. In a preferred embodiment of the present invention, the dielectric film is deposited through chemical deposition at a low temperature causing no recrystallization of the polycrystalline silicon film having the amorphous surface region. Although a heat treatment step is thereafter carried out at a high temperature, the amorphous layer defined on the surface of the polycrystalline silicon film is fixed by the dielectric film and recrystallization thereof is suppressed, so that at least the surface of the polycrystalline silicon film has extremely small crystal grain size. Thus formed is electrode structure, in which the interface between the polycrystalline silicon film serving as a lower electrode and the dielectric film is flat and uniform. Therefore, the dielectric film can be prevented from pinholes and electric field concentration.

These and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention are now described with reference to the drawings.

FIGS. 1A to 1E are sectional views showing steps in a method of manufacturing a semiconductor capacitive element according to a first embodiment of the present invention.

Figure 1A:
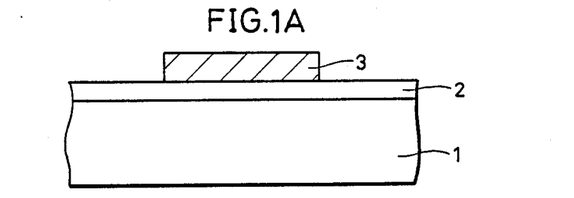
FIGS. 1A, 1B, 1C, 1D and 1E are sectional views successively showing steps of manufacturing a semiconductor capacitive element according to a first embodiment of the present invention.

As shown in FIG. 1A, a polycrystalline silicon film 3 containing no impurity is deposited through CVD on a silicon oxide film 2, which is formed on the surface of a silicon substrate 1, to be 2000 to 3000 Å in thickness. The polycrystalline silicon film 3 is etched in a prescribed configuration through photolithography and etching, thereby to form a lower electrode pattern 3.

Figure 1B:
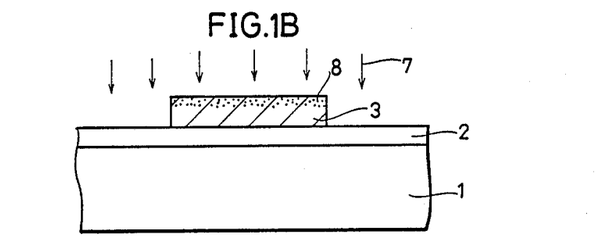
Figure 2:
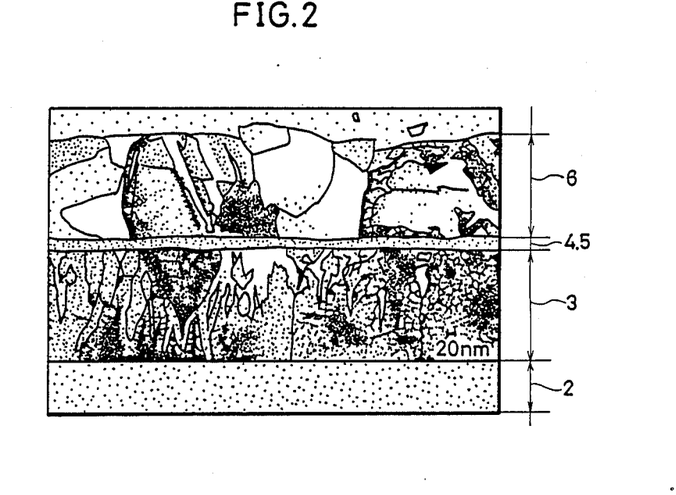
FIG. 2 is a typical sectional view showing crystal structure of a semiconductor capacitive element manufactured through the method according to the present invention.

Then, as shown in FIG. 1B, arsenic ions 7 are ion-implanted into the surface of the polycrystalline silicon film (lower electrode) 3. This step of ion-implanting the arsenic ions 7 is adapted to provide the polycrystalline silicon film 3 with conductivity by adding an impurity, as well as to make the surface of the polycrystalline silicon film 3 amorphous. When the arsenic ions 7 are ion-implanted by about $2 \times 10^{15}/cm^2$ at 50 keV, for example, a completely amorphous layer 8 is defined in depth of about 600 Å from the surface of the polycrystalline silicon film 3, which has been formed by an aggregate of microcrystals of about 200 Å in crystal grain size upon deposition. As can be seen from FIG. 2, the amorphous layer 8 has a smooth structure with the average grain size being approximately no more than 1000 Å.

Figure 1C:
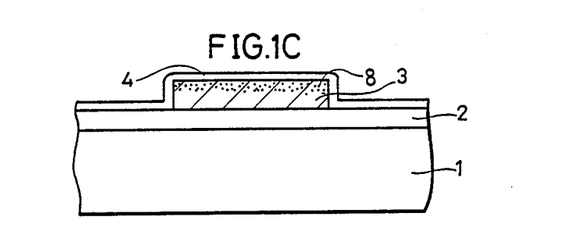

As shown in FIG. 1C, a silicon nitride film 4 is deposited on the polycrystalline silicon film 3, the surface of which is made amorphous, and the surface of the silicon oxide film 2 by thermal reaction of dichlorosilane ($SiH_2Cl_2$) and ammonia ($NH_3$) through LPCVD. The step of depositing the silicon nitride film 4 is carried out under condition which do not cause recrystallization of the amorphous layer 8 of the polycrystalline silicon film 3 forming the lower electrode. For example, according to the preferred embodiment, the deposition temperature for the silicon nitride film 4 is set to be not more than 750° C. Thickness of the silicon nitride film 4 is extremely reduced in order to increase capacitance, to about 5 to 10 nm in practice.

Figure 1D:
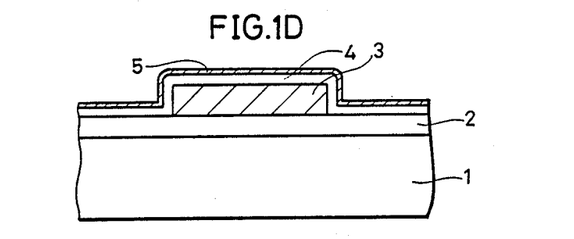

Then, as shown in FIG. 1D, the surface of the silicon nitride film 4 is thermally oxidized to form another silicon oxide film 5 on the surface of the silicon nitride film 4. This thermal oxidation processing is performed in an atmosphere of wet $O_2$ (oxygen containing water vapor) at 900° C. The silicon oxide film 5 thus formed is 1 to 8 nm in thickness. This silicon oxide film 5 is mainly adapted to fill up pinholes or defective parts, which may be formed in the silicon nitride film 4, thereby to repair this film. The silicon oxide film 5, having leak resistance, is also adapted to compensate for the silicon nitride film 4, which commonly permits leak current when a high electric field is applied to the capacitor. In addition, the dielectric film of the capacitor is further improved in reliability by presence of the silicon oxide film 5.

Figure 1E:
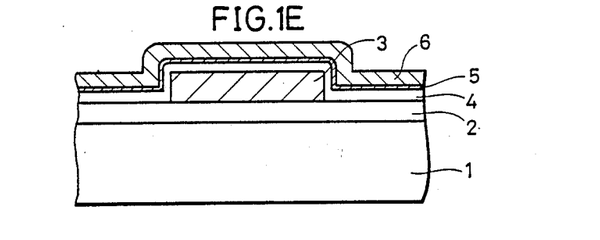

Then, as shown in FIg. 1E, another polycrystalline silicon film 6 is deposited on the surface of the silicon oxide film 5 through CVD. This polycrystalline silicon film 6 defines an upper electrode of the capacitor. The capacitor is manufactured through the aforementioned steps.

The feature of the capacitor obtained in the aforementioned manner resides in that the polycrystalline silicon film 3 defining the lower electrode has small crystal grain size in the vicinity of its surface, so that surface irregularity is extremely reduced. This is clearly understood by comparing FIG. 2 typically showing sectional structure of the inventive capacitor with FIG. 9 typically showing sectional structure of the conventional capacitor. In the conventional capacitor, the surface of the dielectric film (formed by the silicon nitride film 4 and the silicon oxide film 5) sandwiched between the upper and lower polycrystalline silicon films 3 and 6 is extremely irregularized. In the inventive capacitor, on the other hand, the dielectric film (formed by the silicon nitride film 4 and the silicon oxide film 5) is relatively smooth and uniform in thickness.

Figure 3:
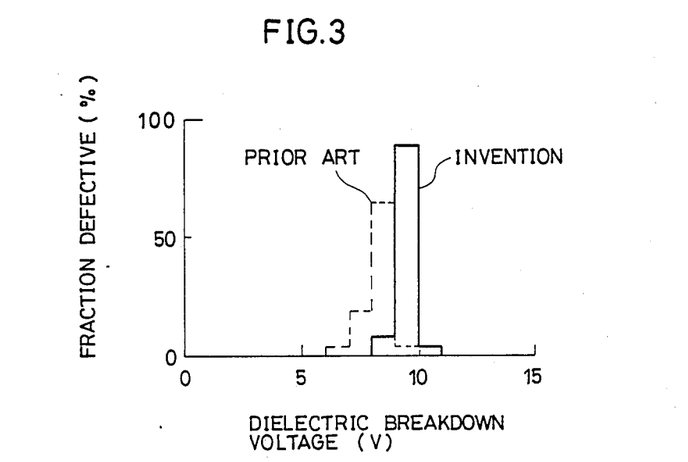
FIG. 3 is a correlation diagram of dielectric breakdown voltage vs. fraction defective showing dielectric breakdown characteristics of semiconductor capacitive elements manufactured through the present invention and the prior art.

Such a capacitor having a dielectric film formed in uniform thickness is hardly deteriorated in voltage resistance by electric field concentration, and reduced in dispersion of voltage resistance distribution. This effect is clearly understood from FIG. 3, showing relation between dielectric breakdown voltage and fraction defective of capacitors. Referring to FIG. 3, dielectric breakdown voltage against the conventional capacitor is about 8 V, while that of the inventive capacitor is increased to 10 V on the average. Further, distribution of defectives with respect to the breakdown voltage is concentrated in the inventive capacitor over only a narrow voltage range compared with the prior art.

Figure 4:
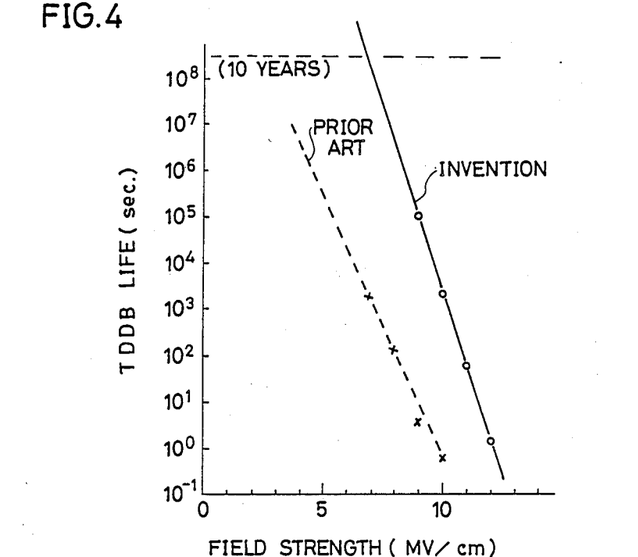
FIG. 4 is a correlation diagram of field strength vs. reliability life showing the reliability life of the inventive semiconductor capacitive element as compared with that of the prior art.

Further, the inventive capacitor is extremely improved in reliable lifetime as compared with the prior art. This is clearly understood from FIG. 4, showing the result of a life test through voltage acceleration (time dependent dielectric breakdown: TDDB). FIG. 4 illustrates relation between strength of electric fields applied to capacitors and the lifetime of the capacitors to breakdown caused by the electric fields. It is clear that the life of the inventive capacitor is longer than that of the conventional one.

Figure 5:
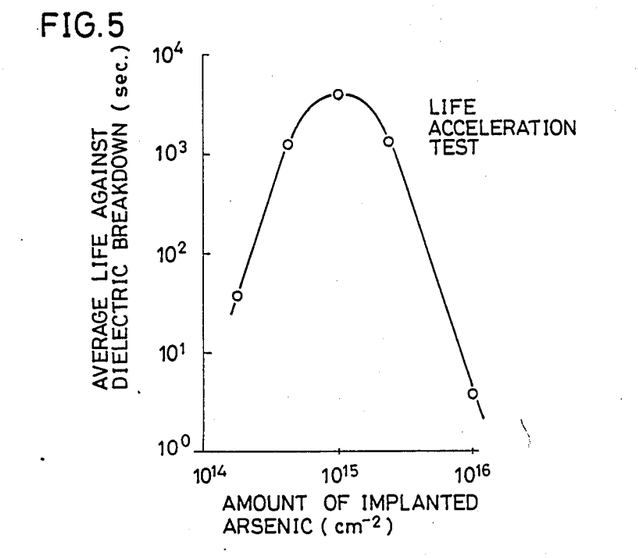
FIG. 5 is a correlation diagram of amount of implantation of arsenic vs. average life against dielectric breakdown showing relation between the amount of arsenic ions implanted into the lower electrode of the semiconductor capacitive element according to the first embodiment of the present invention and life against dielectric breakdown, which is varied with the said amount.

In accordance with the invention, it has been found that there is an optimum value with respect to the amount of implantation of arsenic in the step of performing ion implantation on the polycrystalline silicon film 3 forming the lower electrode. FIG. 5 shows this relation. Referring to FIG. 5, relation of reliable lifetime of a capacitor is changed by varying the amount of arsenic ions implanted into the polycrystalline silicon film forming the lower electrode. As shown in FIG. 5, the surface of the polycrystalline silicon film is insufficiently made amorphous when the amount of implantation of arsenic is small ($10^{14}/cm^2$, for example), and the effect of improving reliability life is insufficient. When the amount of implantation of arsenic is excessive ($10^{16}/cm^2$, for example), on the other hand, the life against dielectric breakdown is again reduced. This may be because an extremely thin oxide film is easily grown by oxygen contained in air entrained in a furnace in formation of the silicon nitride film, to deteriorate voltage resistance. In order to obtain the longest life against dielectric breakdown, therefore, the amount of implantation of arsenic must be set at $1 \times 10^{15}$ to $5 \times 10^{15}/cm^2$.

Figure 6A:
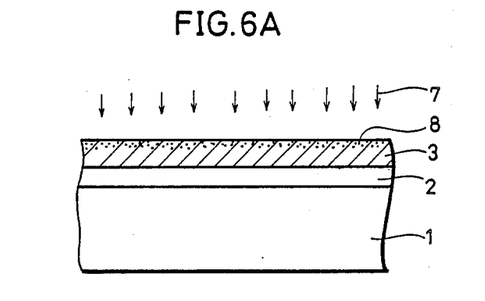
FIGS. 6A and 6B are sectional views showing steps of manufacturing a semiconductor capacitive element according to a second embodiment of the present invention.

A second embodiment of the present invention is now described with reference to FIGS. 6A and 6B. This embodiment is a modification of the process for making the surface region of the polycrystalline silicon film 3, defining the lower electrode, amorphous in the first embodiment. As shown in FIG. 6A, a polycrystalline silicon film 3 is deposited on the surface of a silicon oxide film 2 through CVD. Then, impurity ions 7 such as arsenic ions are implanted into the surface of the polycrystalline silicon film 3, to make a surface region of the polycrystalline silicon film 3 amorphous.

Figure 6B:
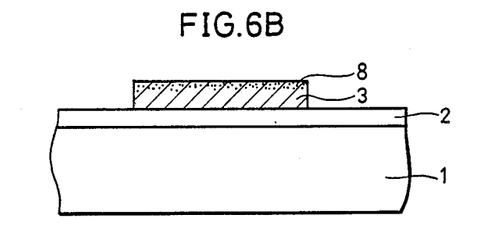

Then, as shown in FIG. 6B, the polycrystalline silicon film 3 is patterned in a prescribed configuration through photolithography and etching, to define a lower electrode 3 of a capacitor.

Subsequent steps are similar to those of the first embodiment. The surface of the lower electrode 3 is also made amorphous through such manufacturing steps, so that the lower electrode 3 has a smooth surface configuration.

A third embodiment of the present invention is now described. This embodiment is a modification of the process for forming the polycrystalline silicon film 3 having the amorphous surface layer, similarly to the second embodiment. First, a polycrystalline silicon film 3, which is doped with an impurity to be provided with conductivity for serving as a lower electrode, is deposited on the surface of a silicon oxide film 2. Thereafter ion implantation is performed in order to make a surface region of the polycrystalline silicon film 3 amorphous. Ions implanted for making the said surface region amorphous are prepared from inactive gas ions of argon or xenon, or group IV ions of silicon, germanium or tin. Subsequent steps are carried out similarly to the first embodiment. In this embodiment, a step of patterning the polycrystalline silicon film may be carried out either before or after the step of implanting ions for making its surface region amorphous.

A fourth embodiment of the present invention is now described. This embodiment is also a modification of the process for forming the polycrystalline silicon film 3 having the amorphous surface layer, similarly to the second and third embodiments. In this embodiment, an amorphous silicon layer is deposited on the surface of a silicon oxide film 2 through direct sputtering or the like. Thus, the step of making the surface of a polycrystalline silicon film amorphous by ion implantation can be omitted. Thereafter the amorphous silicon layer is patterned to form a lower electrode 3 of a capacitor. Subsequent steps are carried out similarly to those of the aforementioned embodiments.

Although the upper electrode of the capacitor is formed by a polycrystalline silicon layer in each of the aforementioned embodiments, the present invention is not restricted to this but the upper electrode may be formed by a conductive film such as a metal thin film.

Further, although the dielectric film of the capacitor is in two-layer structure of the silicon nitride film and the silicon oxide film in each embodiment, the present invention is not restricted to this but the effect thereof can be attained also when the dielectric film is formed only by a silicon oxide film or a silicon nitride film.

Figure 7:
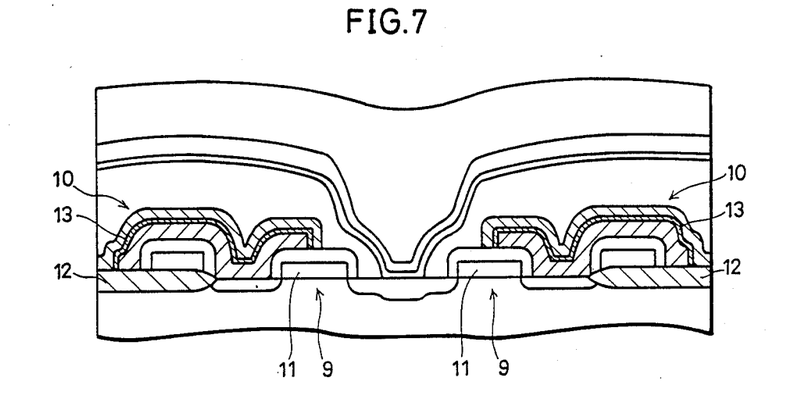
FIG. 7 is a sectional view showing the structure of a D-RAM to which the inventive method of manufacturing a semiconductor capacitive element is applied.

The inventive method of manufacturing a capacitor has been described with reference to a capacitor flatly formed on the surface of a semiconductor substrate with reference to each of the aforementioned embodiments, while application to a capacitor of a stacked type D-RAM is considered as the most preferable embodiment, as shown in FIG. 7. FIG. 7 illustrates sectional structure of two memory cells of such a D-RAM. Each memory cell is formed by one access transistor 9 and one capacitor 10. The capacitor 10 is extended over a gate electrode 11 of the access transistor 9 and an upper part of a field oxide film 12. In the capacitor 10 of such a highly integrated type memory cell, an interelectrode area must be increased in order to ensure capacitance, while the thickness of its dielectric film 13 must be made as thin as possible. Thus, the present invention can be effectively applied to the method of manufacturing the capacitor of such a D-RAM, to obtain a highly reliable capacitor 10 having long life, which has the dielectric film 13 of uniform thickness.

In the inventive semiconductor capacitive element as hereinabove described, the surface of the polycrystalline silicon layer forming the lower electrode is made amorphous to obtain a smooth surface configuration. The dielectric film is formed at a temperature causing no recrystallization of the smooth surface. Thus, the dielectric film is formed in uniform thin film structure, following the smooth surface configuration of the polycrystalline silicon film. Such thin film structure uniformalizes voltage resistance distribution of the semiconductor capacitive element, while improving dielectric breakdown voltage resistance. Thus, the semiconductor capacitive element can be increased in reliability life.

According to the present invention, as hereinabove described, the surface region of the lower electrode of the semiconductor capacitive element is made amorphous and thereafter the dielectric film is deposited in a state causing no recrystallization, whereby the lower electrode can be extremely reduced in crystal grain size and its surface can be flattened. Thus, the quality of the dielectric thin film formed on the upper surface thereof is improved and voltage resistance of the semiconductor capacitive element is improved, while reliability thereof is extremely improved.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing a semiconductor capacitor provided with a base, a dielectric film formed on said base and a pair of electrode layers stacked on both sides of said dielectric film, said method comprising the steps of:
   forming, as one of said electrode layers, a polycrystalline silicon layer on said base having at least a surface region thereof which is amorphous;
   forming said dielectric film on said polycrystalline silicon layer while maintaining an amorphous surface state; and
   forming another one of said electrode layers on said dielectric film.

2. A method of manufacturing a semiconductor capacitor according to claim 1, wherein the step of forming said polycrystalline silicon layer having at least surface region thereof is amorphous comprises the steps of:
   forming a polycrystalline silicon layer for serving as one of said electrode layers on said base; and
   making at least a surface region of said polycrystalline silicon layer amorphous.

3. A method of manufacturing a semiconductor capacitor in accordance with claim 2, wherein said step of making said surface region of said polycrystalline silicon layer amorphous includes a step of ion-implanting an impurity into the surface of said polycrystalline silicon layer.

4. A method of manufacturing a semiconductor capacitor in accordance with claim 3, wherein said ion implantation step is adapted to ion-implant arsenic ions into the surface of said polycrystalline silicon layer in an amount of implantation of $1 \times 10^{15}$ to $5 \times 10^{15}/cm^2$.

5. A method of manufacturing a semiconductor capacitor in accordance with claim 2, wherein said step of forming said polycrystalline silicon layer in which at least said surface region is made amorphous includes the steps of:
   depositing said polycrystalline silicon layer to which a first impurity is added on said base, and
   ion-implanting a second impurity into the surface of said polycrystalline silicon layer to make said surface region amorphous.

6. A method of manufacturing a semiconductor capacitor in accordance with claim 5, wherein said ion implantation step is adapted to ion-implant arsenic ions, inert gas ions or group IV impurity ions as said second impurity.

7. A method of manufacturing a semiconductor capacitor in accordance with claim 2, wherein said step of forming said dielectric film is carried out in a temperature range causing no recrystallization of said polycrystalline silicon layer whose surface region is made amorphous.

8. A method of manufacturing a semiconductor capacitor in accordance with claim 7, wherein said dielectric film is formed at a temperature not more than 750° C.

9. A method of manufacturing a semiconductor capacitor in accordance with claim 7, wherein said dielectric film is formed by depositing a silicon nitride film, a silicon oxide film, a tantalum oxide film, a hafnium oxide film or a titanium oxide film.

10. A method of manufacturing a semiconductor capacitor in accordance with claim 7, wherein said step of forming said dielectric film includes the steps of:
   depositing a silicon nitride film by chemical deposition, and
   oxidizing the surface of said silicon nitride film thereby to form a silicon oxide film on the surface of said silicon nitride film.

11. A method of manufacturing a semiconductor capacitor in accordance with claim 10, wherein said step of making said surface region of said polycrystalline silicon layer amorphous includes a step of ion-implanting an impurity into the surface of said polycrystalline silicon layer.

12. A method of manufacturing a semiconductor capacitor according to claim 1, wherein said step of forming said polycrystalline silicon layer having at least surface region thereof made amorphous comprises the step of:
depositing an amorphous silicon layer on a surface of said base.

13. A method of maintaining the small grain size of electrode layer comprising the steps of:
forming a polycrystalline silicon layer for serving as said electrode layer on a base having at least surface region thereof which is amorphous; and
forming an insulating film on said polycrystalline silicon layer while maintaining the amorphous surface state.

14. A method of suppressing recrystallization of electrode layer comprising the steps of:
forming a polycrystalline silicon layer for serving as said electrode layer on a base having at least surface region thereof which is amorphous; and
forming an insulating film on said polycrystalline silicon layer while maintaining the amorphous surface state.

15. In a method of forming an amorphous silicon layer on a surface of base the improvement comprising the steps of:
forming a polycrystalline silicon layer on the surface of said base, and introducing impurities by ion implantation to said polysilicon layer so as to make said polycrystalline silicon layer amorphous.

16. A capacitor formed on a semiconductor substrate, comprising:
a first electrode being a polycrystalline silicon layer including impurities for increasing a conductive rate and having an amorphous silicon surface layer;
a dielectric layer formed on said first electrode; and
a second electrode formed on said dielectric layer.

17. A capacitor formed on semiconductor substrate, comprising:
a first electrode being a polycrystalline silicon layer including impurities for increasing a conductive rate, an average grain size of at least surface layer of said polycrystalline silicon being smaller than 1000 Å,
a dielectric layer of a thickness of less than 200 Å, in equivalent to silicon oxide film, formed on said first electrode; and
a second electrode formed on said dielectric layer;
whereby, irregularities in the surface of said first electrode are maintained at a value less than the thickness of said dielectric layer.

* * * * *